US006988898B2

(12) United States Patent
Tanabe

(10) Patent No.: US 6,988,898 B2
(45) Date of Patent: Jan. 24, 2006

(54) SIGNAL REPEATING DEVICE

(75) Inventor: Shinji Tanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 126 days.

(21) Appl. No.: 10/491,789

(22) PCT Filed: Feb. 12, 2003

(86) PCT No.: PCT/JP03/01446

§ 371 (c)(1), (2), (4) Date: Apr. 6, 2004

(87) PCT Pub. No.: WO03/069723

PCT Pub. Date: Aug. 21, 2003

(65) Prior Publication Data

US 2004/0198075 A1 Oct. 7, 2004

(30) Foreign Application Priority Data

Feb. 12, 2002 (JP) ...................................... 2002-034422

(51) Int. Cl.
*H01R 13/648* (2006.01)

(52) U.S. Cl. ........................................... 439/65; 439/61

(58) Field of Classification Search .................. 439/65, 439/61, 66, 63, 108, 608, 630, 607, 45; 361/816, 361/424, 767–771; 29/854; 174/255, 258, 174/261

See application file for complete search history.

(56) References Cited

U.S. PATENT DOCUMENTS 5,104,341 A 4/1992 Gilissen et al.

FOREIGN PATENT DOCUMENTS

| | | |
|---|---|---|
| JP | 2-76401 | 3/1990 |
| JP | 4-28182 | 1/1992 |

*Primary Examiner*—Alexander Gilman

(57) ABSTRACT

A communication equipment includes short-circuited stubs electrically connecting signal through holes to ground through holes, respectively. Thus, it reduces signal reflection even if the transmission speed of a signal is increased.

8 Claims, 6 Drawing Sheets

SIGNAL REPEATING DEVICE

TECHNICAL FIELD

The present invention relates to a stub structure for preventing signal reflection that will occur when transmitting a signal from a first board to a second board.

BACKGROUND ART

FIG. 1 is a diagram showing a configuration of a conventional board connection on a transmission line disclosed in Japanese patent application laid-open No. 4-28182/1992, for example. In FIG. 1, the reference numeral 1 designates a daughter card; 2 designates a transmission path of the daughter card 1; 3 designates a signal through hole (through hole used for a signal) of the daughter card 1; 4 designates a ground layer; 5 designates a ground through hole (through hole used for a ground) of the daughter card 1; 6 designates a backplane; 7 designates a transmission path of the backplane 6; 8 designates a signal through hole of the backplane 6; 9 designates a ground layer; 10 designates a ground through hole of the backplane 6; 11 designates a connector having its connector pin 11*a* inserted into the signal through hole 3 of the daughter card 1 and its connector pin 11*b* inserted into the signal through hole 8 of the backplane 6; and 12 designates a connector having its connector pin 12*a* inserted into the ground through hole 5 of the daughter card 1, and its connector pin 12*b* inserted into the ground through hole 10 of the backplane 6.

Next, the operation will be described.

The connector pin 11*a* of the connector 11 is inserted into the signal through hole 3 of the daughter card 1, and the connector pin 11*b* of the connector 11 is inserted into the through hole 8 of the backplane 6.

Thus, the transmission path 2 of the daughter card 1 is electrically connected to the transmission path 7 of the backplane 6.

Accordingly, a signal output from a driver or the like installed in the daughter card 1 is transmitted from the transmission path 2 of the daughter card 1 to the transmission path 7 of the backplane 6 via the connector 11.

However, if the characteristic impedance of the transmission path 2 of the daughter card 1 differs from that of the transmission path 7 of the backplane 6, the impedance mismatching will bring about signal reflection, which prevents high-speed transmission of the signal.

In view of this, to minimize the signal reflection due to the impedance mismatching, the conventional transmission lines make a contrivance as to the placement of the ground and reducing the length of the fitting portion of the connector 11.

With the foregoing arrangement, the conventional communication equipment can control the signal reflection as long as the transmission speed of the signal is within a certain limit. However, as the transmission speed of the signal further increases, a problem arises of being unable to control signal reflection sufficiently by only contriving the placement of the ground and the length of the fitting portion of the connector 11.

The present invention is implemented to solve the foregoing problem. Therefore it is an object of the present invention to provide a stub line for controlling the signal reflection even if the transmission speed of the signal is increased.

DISCLOSURE OF THE INVENTION

The signal transmitter in accordance with the present invention includes electrical short stubs connected to signal through holes in first and second boards.

This offers an advantage of being able to control the signal reflection even if the transmission speed of the signal is increased.

BEST MODE FOR CARRYING OUT THE INVENTION

The best mode for carrying out the invention will now be described with reference to the accompanying drawings to explain the present invention in more detail.

Embodiment 1

Figure 1:
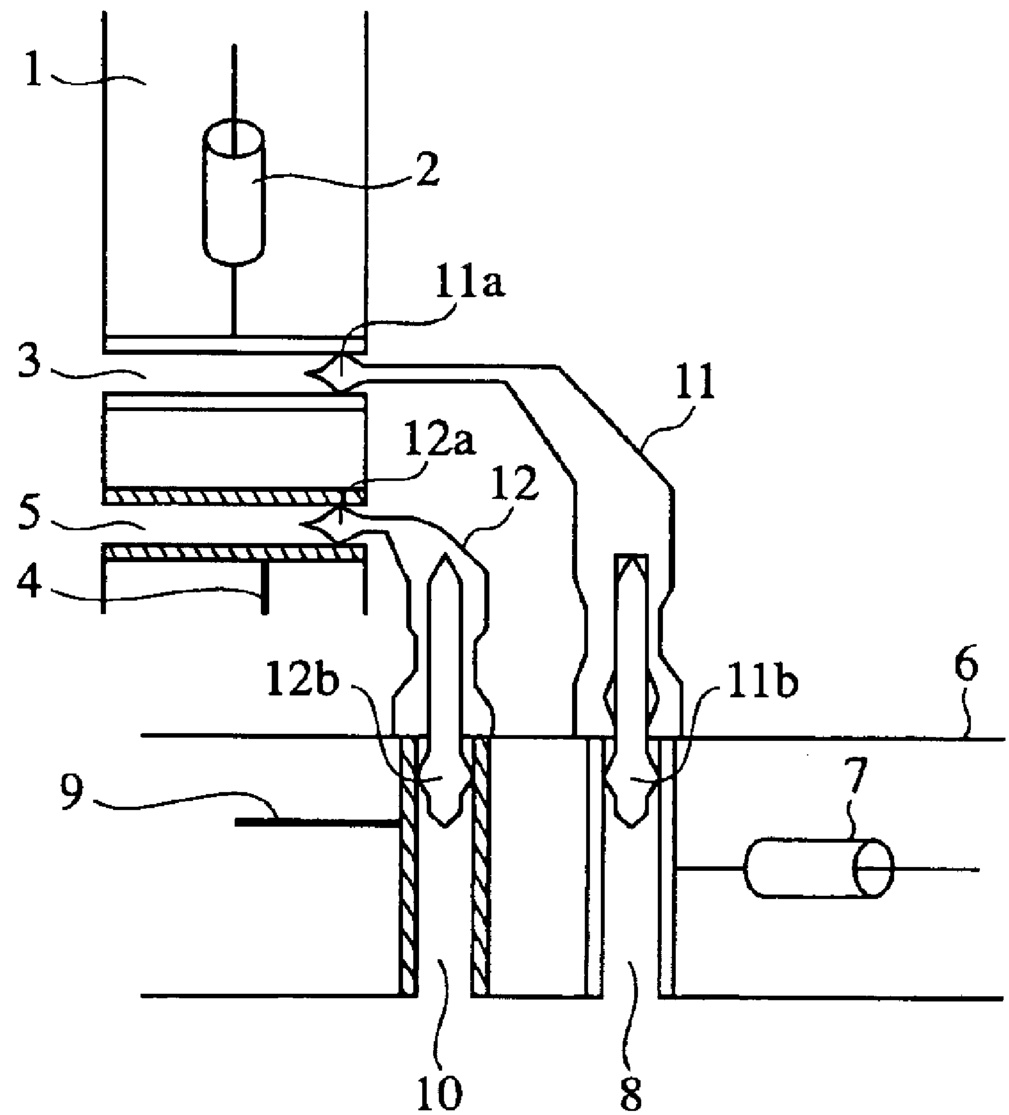
FIG. 1 is a diagram showing a configuration of conventional communication equipment.
Figure 2:
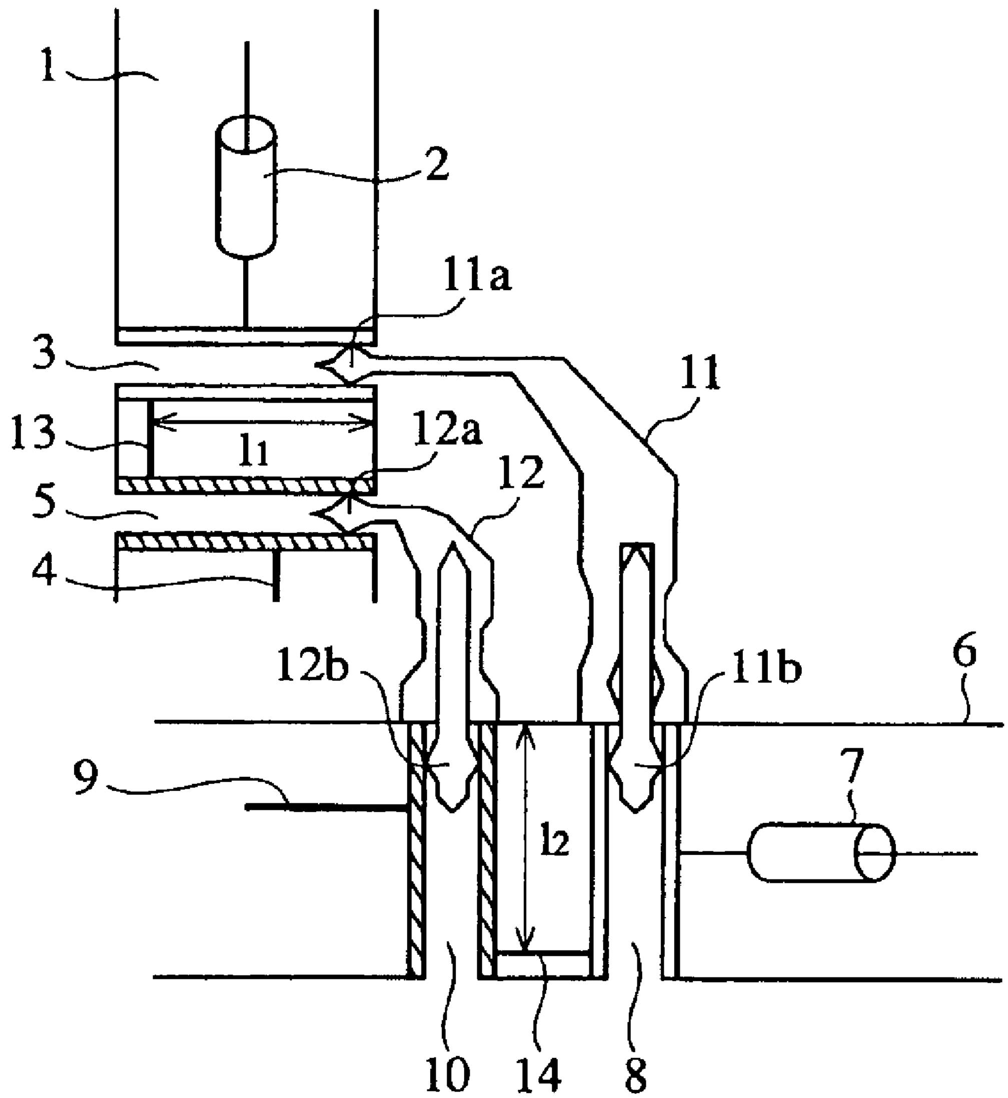
FIG. 2 is a diagram showing a configuration of an embodiment 1 of the signal transmitter in accordance with the present invention.
Figure 3:
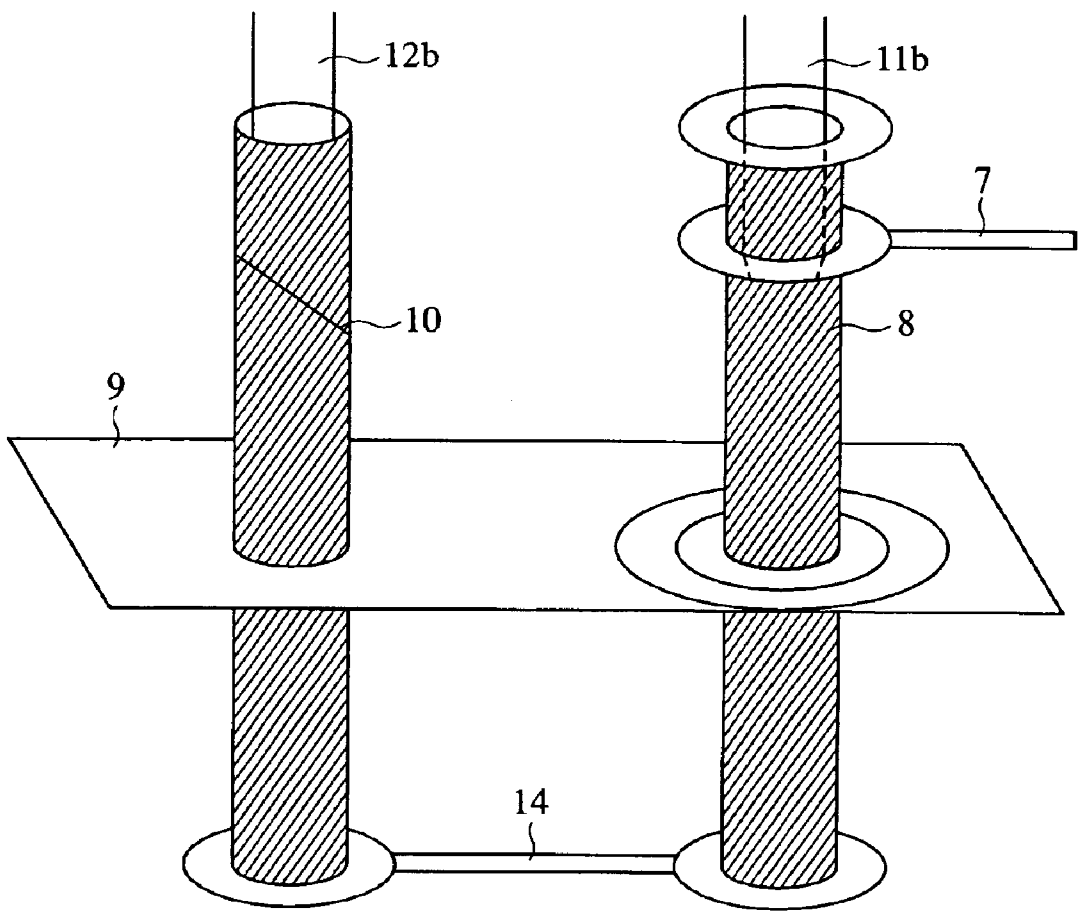
FIG. 3 is an enlarged perspective view of a backplane of the equipment of FIG. 2.

FIG. 2 is a diagram showing a configuration of an embodiment 1 of the communication equipment in accordance with the present invention; and FIG. 3 is an enlarged perspective view of a backplane of the equipment of FIG. 2. In FIG. 2, the reference numeral 1 designates a daughter card (first board); 2 designates a transmission path of the daughter card 1; 3 designates a signal through hole (through hole used for a signal) of the daughter card 1; 4 designates a ground layer; 5 designates a ground through hole (through hole used for a ground) of the daughter card 1; 6 designates a backplane (second board); 7 designates a transmission path of the backplane 6; 8 designates a signal through hole of the backplane 6; 9 designates a ground layer; and 10 designates a ground through hole of the backplane 6.

The reference numeral 11 designates a connector (first connector) having its connector pin 11*a* inserted into the signal through hole 3 of the daughter card 1 and its connector pin 11*b* inserted into the signal through hole 8 of the backplane 6; and 12 designates a connector (second connector) having its connector pin 12*a* inserted into the ground through hole 5 of the daughter card 1, and its connector pin 12*b* inserted into the ground through hole 10 of the backplane 6. The connectors 11 and 12 constitute transmission lines.

The reference numeral 13 designates a short stub for electrically connecting the signal through hole 3 with the ground through hole 5, and 14 designates a short stub for electrically connecting the signal through hole 8 with the ground through hole 10.

Next, the operation will be described.

The connector pin 11*a* of the connector 11 is inserted into the signal through hole 3 of the daughter card 1, and the connector pin 11*b* of the connector 11 is inserted into the through hole 8 of the backplane 6.

Thus, the transmission path 2 of the daughter card 1 is electrically connected to the transmission path 7 of the backplane 6.

Accordingly, a signal output from a driver or the like installed in the daughter card 1 is transmitted from the transmission path 2 of the daughter card 1 to the transmission path 7 of the backplane 6 via the connector 11.

However, if the characteristic impedance of the transmission path 2 of the daughter card 1 differs from that of the transmission path 7 of the backplane 6, the impedance mismatching will bring about signal reflection, which prevents high-speed transmission of the signal.

In view of this, to control the signal reflection, the present embodiment 1 has the electrical short stub 13 connected to the signal through hole 3 of the daughter card 1, and the electrical short stub 14 connected to the signal through hole 8 of the backplane 6.

In other words, the signal through hole 3 is electrically connected to the ground through hole 5 by the short stub 13 in the daughter card 1, and the signal through hole 8 is electrically connected to the ground through hole 10 by the short stub 14 in the backplane 6.

Here, the connecting position 11 of the short stub 13 to the transmission path is determined such that the normalized conductance g, which is obtained by dividing the imaginary component of the input admittance $Y_i$ by the characteristic admittance $Y_0$ (=$1/Z_0$) of the transmission path 2, becomes "1". Here, the input admittance $Y_i$ is defined as the admittance seen by looking into the load side, the connector 11, from the signal source side, the daughter card 1.

Figure 4:
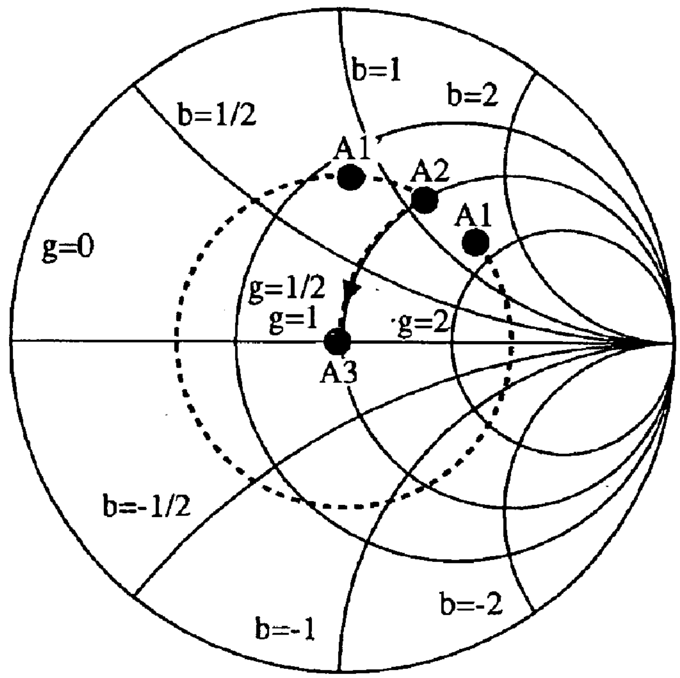
FIG. 4 is a diagram illustrating an admittance diagram (Smith chart)

More specifically, as illustrated in the admittance diagram (Smith chart) of FIG. 4, considering that the input impedance of the connector 11 equals the load impedance $Z_L$, its admittance point is denoted by A1 in FIG. 4.

Here, considering that the ground through hole 5 is inductive, a condition is set such that the load impedance $Z_L$ (characteristic impedance) of the connector 11 becomes greater than the characteristic impedance of the transmission path 2 of the daughter card 1. Then, the position of the standing wave moves so that the distance from the tip of the connector pin 11*a* to the connecting position of the short stub 13 to the transmission path can be sharply reduced to about 1/10 of the wavelength. Thus, the admittance point is moved from A1 to A1' by setting the load impedance of the connector 11 such that the foregoing condition is satisfied. In this case, the short stub 13 can be fixed to the ground through hole 5 directly.

Next, a decision is made such that the normalized conductance g becomes "1", which is obtained by dividing the imaginary component of the input admittance $Y_i$ seen by looking into the connector 11 from the daughter card 1 side by the characteristic admittance $Y_0$ (=$1/Z_0$) of the transmission path 2. Thus, the admittance point is moved from A1' to A2 on a curve on which g=1.

Subsequently, a condition is set such that the length of the short stub 13 matches the ratio between the characteristic impedance (characteristic admittance) of the short stub 13 and the input reactance (susceptance) of the short stub 13. Then, the inductance of the short stub 13 and the capacitance of the line (line from the tip of the connector pin 11*a* to the connecting position of the short stub 13) have their susceptance components canceled each other. Accordingly, the admittance point is moved from A2 to A3, the origin of the Smith chart, by setting the length of the short stub 13 such that it meets the foregoing condition. Thus, the impedance matching is achieved.

Incidentally, when the backplane 6 is a signal source, the short stub 14 is provided, which electrically connects the signal through hole 8 to the ground through hole 10. In this case, the connecting position $l_2$ of the short stub 14 is determined in the same manner as that of the short stub 13. In other words, it is determined such that the normalized conductance g becomes "1", which is, obtained by dividing the imaginary component of the input admittance $Y_i$ seen by looking into the load side, the connector 11, from the signal source, the backplane 6 side, by the characteristic admittance $Y_0$ (=$1/Z_0$) of the transmission path 7.

As described above, the present embodiment 1 is configured such that it comprises the short stub 13 or 14 for electrically connecting the signal through hole 3 or 8 to the ground through hole 5 or 10, respectively. Thus, the present embodiment 1 offers an advantage of being able to control the signal reflection even if the transmission speed of the signal is increased.

Specifically, it can improve the S/N, jitter and error rate of the device because the signal energy on the transmission path is transmitted to the final stage or another side receiver without loss.

Furthermore, the present embodiment 1 is configured such that it sets the load impedance $Z_L$ of the connector 11 greater than the characteristic impedance of the transmission path 2 of the daughter card 1. Thus, the present embodiment 1 offers an advantage of being able to reduce the distance from the tip of the connector pin 11*a* to the connecting position of the short stub 13 to about 1/10 of the wavelength.

Embodiment 2

Figure 5:
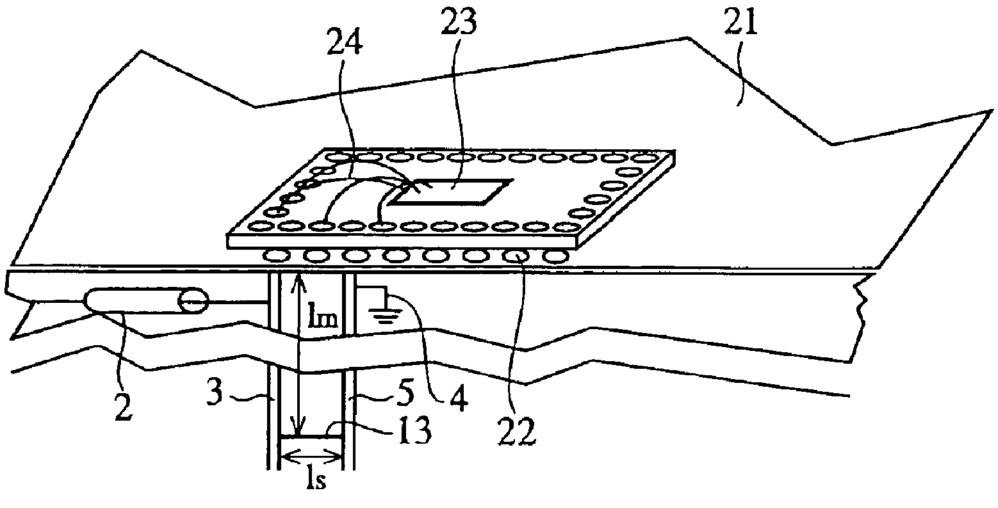
FIG. 5 is a view showing a configuration of an embodiment 2 of the communication equipment in accordance with the present invention.

FIG. 5 is a view showing a configuration of an embodiment 2 of the package in accordance with the present invention. In FIG. 5, the same reference numerals designate the same or like portions to those of FIG. 2, and their description will be omitted here.

In FIG. 5, the reference numeral 21 designates a printed circuit board on which an LSI 23 is mounted, 22 designates a ball, 23 designates the LSI corresponding to a board (second board) on a signal receiving side, and 24 designates bonding wires electrically connecting the ball 22 with the pins of the LSI 23. The printed circuit board 21, balls 22 and bonding wires 24 constitute a package.

Although the signal transmitting section consists of the connectors 11 and 12 in the foregoing embodiment 1, it may consists of the package electrically connecting the transmission path 2 of the board on the signal transmitting side with the pins of the LSI 23 mounted on the package as shown in FIG. 5.

In this case, the connecting position $l_m$ and length $l_s$ of the short stub 13 are determined such that the inductive susceptance (reactance), the imaginary part of the admittance (impedance), of the short stub 13 is canceled by the capacitive susceptance (reactance), the imaginary part of the admittance (impedance), seen by looking into the LSI 23 side from the connecting position of the short stub 13.

More specifically, the connecting position $l_m$ of the short stub 13 is determined such that the normalized conductance g, which is obtained by dividing the imaginary component of the input admittance $Y_i$ seen by looking into the LSI 23 from the signal transmitting side by the characteristic admittance $Y_0$ (=$1/Z_0$) of the transmission path 2, becomes "1" by using a Smith chart, or the following expression (1).

$$Y_i=Y_0(Y_L \cos \beta l_m+jY_0 \sin \beta l_m)/(Y_0 \cos \beta l_m+jY_L \sin \beta l_m) \quad (1)$$

$$1/Y_0=Z_0=(\eta/\pi)\cos h^{-1}(d/\phi) \quad (2)$$

where

β: phase constant ($\beta=\omega/\lambda$);

$Y_L$: admittance of the signal transmission line;

η: wave impedance in free space;

φ: diameter of the through holes 3 and 5; and d: distance between the signal through hole 3 and ground through hole 5.

On the other hand, the length $l_s$ of the short stub 13 is obtained such that when the susceptance seen by looking into the LSI 23 from the connecting position of the short stub 13 $l_m$ is B[S], the susceptance seen by looking into the short connected side of the short stub 13 from the connecting position $l_m$ of the short stub 13 becomes −B[S] by using a Smith chart or the following expression (3). The following expression (3) is obtained by placing the admittance $Y_L$ of the signal transmitting section in the foregoing expression (1) at infinity (∞: short-circuited).

$$Y_i = -jY_0 \cos \beta l_s \quad (3)$$

As described above, the present embodiment 2 is configured such that the signal transmitting section consists of the package electrically connecting the transmission path 2 of the board on the signal transmitting side with the pins of the LSI 23 mounted on the package. Thus, the present embodiment 2 offers an advantage of being able to control the signal reflection even if the package is used as the signal transmitting section.

In addition, the present embodiment 2 is configured such that the connecting position $l_m$ of the short stub 13 is determined considering the admittance $Y_L$ of the signal transmitting section, the characteristic admittance $Y_0$ of the transmission path 2 of the board, the input admittance $Y_i$ seen by looking into the signal transmitting section from the transmission path of the board, and the phase constant β. Accordingly, the present embodiment 2 offers an advantage of being able to control the signal reflection, even if the transmission speed of the signal is increased.

Furthermore, the present embodiment 2 is configured such that the length $l_s$ of the short stub 13 is determined considering the characteristic admittance $Y_0$ of the transmission path 2 of the board, the input admittance $Y_i$ seen by looking into the signal transmitting section from the transmission path of the board, and the phase constant β. Accordingly, the present embodiment 2 offers an advantage of being able to control the signal reflection, even if the transmission speed of the signal is increased.

Embodiment 3

Figure 6A:
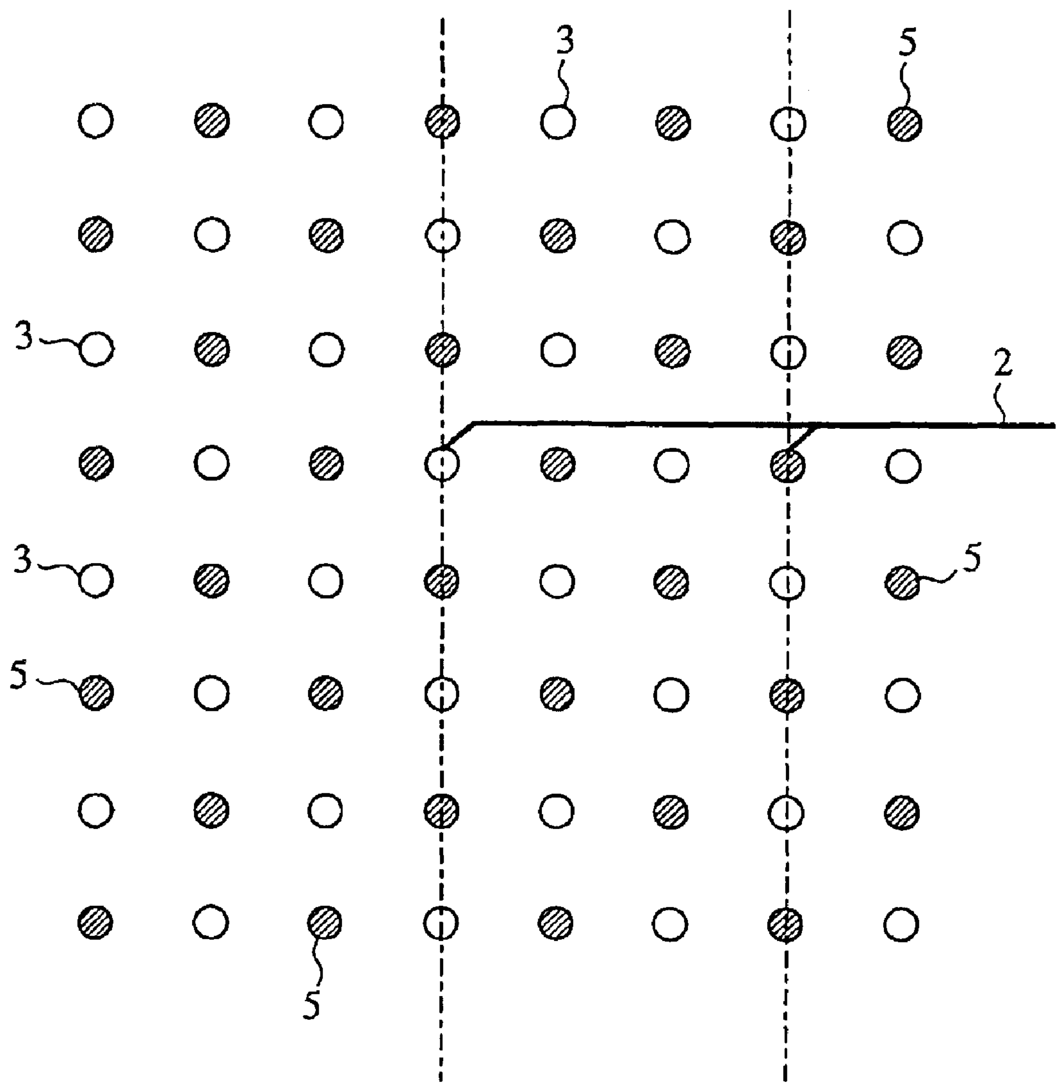
FIG. 6(*a*) is a plane view showing a layout of through holes, and FIG. 6(*b*) is a cross-sectional view of some of the through holes.
Figure 6B:
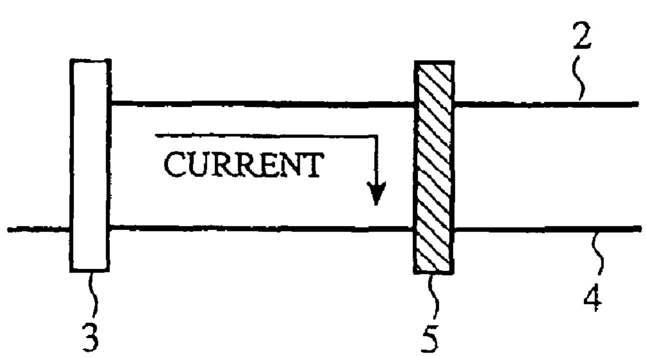

Although the foregoing embodiment 1 is described by way of example including a single signal through hole 3 and ground through hole 5 placed in the daughter card 1, a plurality of signal through holes 3 and ground through holes 5 can be placed in the daughter card 1. In this case, the signal through holes 3 and ground through holes 5 can be disposed alternately at regular intervals as shown FIGS. 6(*a*) and 6(*b*).

Here, the connecting position $l_m$ of the short stub 13 is determined by the foregoing expression (1), and the length $l_s$ of the short stub 13 is determined by using the foregoing expression (3) or the Smith chart of FIG. 4.

Thus, the present embodiment 3 offers an advantage of being able to determine the connecting position $l_m$ and length $l_s$ of the short stub 13 flexibly over a wide range.

Embodiment 4

Figure 7A:
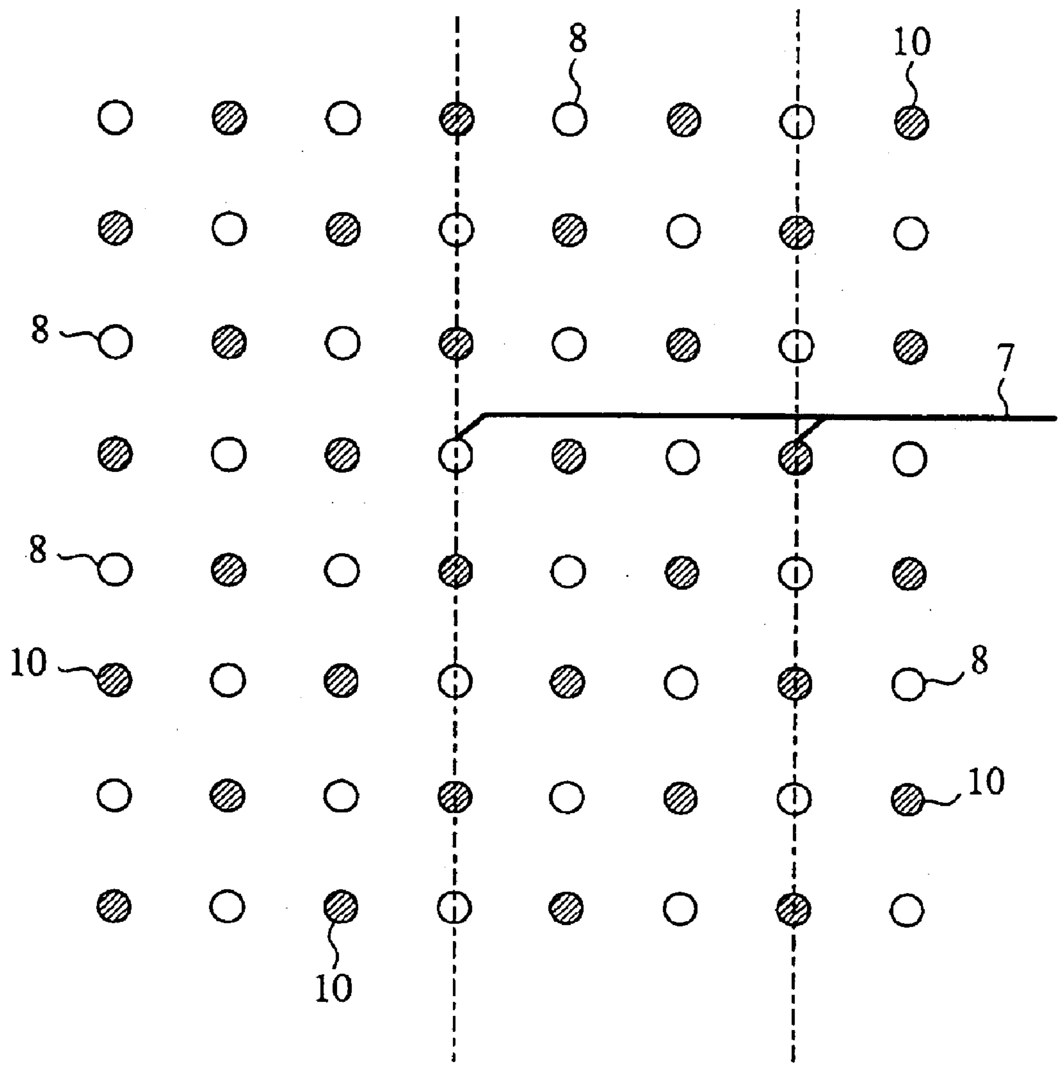
FIG. 7(*a*) is a plane view showing a layout of through holes, and FIG. 7(*b*) is a cross-sectional view of some of the through holes.
Figure 7B:
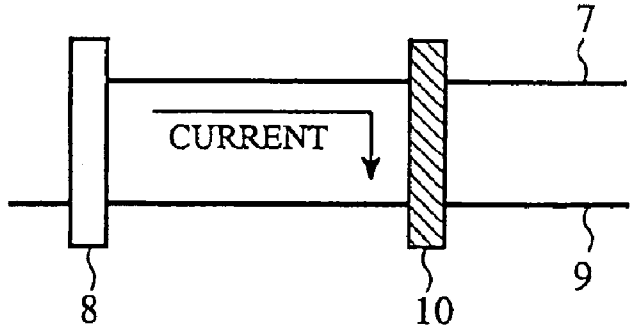

The foregoing embodiment 3 is described by way of example including signal through holes 3 and ground through holes 5 disposed alternately at regular intervals. However, when transmitting a signal from the backplane 6 to the daughter card 1, signal through holes 8 and ground through holes 10 can be disposed alternately at regular intervals as shown in FIGS. 7(*a*) and 7(*b*).

Here, the connecting position $l_m$ of the short stub 14 is determined by the foregoing expression (1), and the length $l_s$ of the short stub 14 is determined by using the foregoing expression (3) or the Smith chart of FIG. 4.

Thus, the present embodiment 4 offers an advantage of being able to determine the connecting position $l_m$ and length $l_s$ of the short stub 14 flexibly over a wide range.

Industrial Applicability

As described above, the communication equipment in accordance with the present invention is applicable to reducing the signal reflection as much as possible which occurs when transmitting a signal from a first board to a second board that are connected with each other.

What is claimed is:

1. A communication equipment comprising a signal transmitting section for electrically connecting a first transmission path, that is connected to a signal through hole in a first board, to a second transmission path, that is connected to a signal through hole in a second board, wherein the signal through holes in the first and second boards are each connected to respective electrically short-circuited stubs.

2. The communication equipment according to claim 1, wherein the signal transmitting section has a characteristic impedance larger than characteristic impedance of the first and second transmission paths of the first and second boards.

3. The communication equipment according to claim 1, wherein the signal transmitting section comprises a first connector having a first connector pin inserted into the signal through hole of the first board and a second connector pin inserted into the signal through hole of the second board; and a second connector having a first connector pin inserted into a ground through hole of the first board and a second connector pin inserted into a ground through hole of the second board.

4. The communication equipment according to claim 1, wherein the second board consists of an LSI, the signal transmitting section is a package that incorporates the LSI and electrically connects the transmission path of the first board to a pin of the LSI.

5. The communication equipment according to claim 1, wherein a connecting position of the short-circuited stub to the first transmission path is determined considering admittance of said signal transmitting section, characteristic admittance of the first transmission path of the first board, input admittance seen by looking into the signal transmitting section from the first transmission path of the first board, and a phase constant.

6. The communication equipment according to claim 1, wherein length of one of the short-circuited stubs is determined considering characteristic admittance of the transmission path of the first board, input admittance seen by looking into the signal transmitting section from the first transmission path of the first board, and a phase constant.

7. The communication equipment according to claim 1, wherein the short-circuited stubs respectively electrically connect the signal through holes to ground through holes that are connected to a ground.

8. The communication equipment according to claim 7, wherein when locating a plurality of signal through holes and a plurality of ground through holes in at least one of the first and second boards, the connecting position of the short circuited stubs is determined considering admittance of the signal transmitting section, characteristic admittance of the first transmission path of the first board, input admittance seen by looking into the signal transmitting section from the first transmission path of the first board, and a phase constant;

the length of one of the short-circuited stubs is determined considering the characteristic admittance of the first transmission path of the first board, the input admittance seen by looking into the signal transmitting section from the first transmission path of the first board, and the phase constant; and the signal through holes and the ground through holes are disposed alternately at regular intervals in at least one of the first and second boards.

* * * * *